United States Patent
Im et al.

(10) Patent No.: US 7,697,249 B2
(45) Date of Patent: Apr. 13, 2010

(54) VOLTAGE CLAMPING CIRCUITS USING MOS TRANSISTORS AND SEMICONDUCTOR CHIPS HAVING THE SAME AND METHODS OF CLAMPING VOLTAGES

(75) Inventors: Kyoung-Sik Im, Yongin-si (KR); Han-Gu Kim, Seongnam-si (KR); Jae-Hyok Ko, Suwon-si (KR); Il-Hun Son, Seoul (KR); Suk-Jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 394 days.

(21) Appl. No.: 11/646,535

(22) Filed: Dec. 28, 2006

(65) Prior Publication Data

US 2007/0177329 A1    Aug. 2, 2007

(30) Foreign Application Priority Data

Jan. 6, 2006    (KR) .................... 10-2006-0001668

(51) Int. Cl.
*H02H 3/22*    (2006.01)
(52) U.S. Cl. ..................................... 361/56; 361/111
(58) Field of Classification Search ............... 361/56, 361/111
See application file for complete search history.

(56) References Cited

U.S. PATENT DOCUMENTS

| | | | | |
|---|---|---|---|---|
| 5,838,146 | A | * 11/1998 | Singer | ............ 323/270 |
| 6,731,488 | B2 | * 5/2004 | Voldman | ............ 361/111 |
| 2005/0152082 | A1 | 7/2005 | Lee | |

FOREIGN PATENT DOCUMENTS

| JP | 2005-064374 | 3/2005 |
|---|---|---|
| JP | 2005-235947 | 9/2005 |
| KR | 10-2003-0098493 | 12/2003 |
| WO | WO 00/27012 | 5/2000 |

* cited by examiner

*Primary Examiner*—Danny Nguyen
(74) *Attorney, Agent, or Firm*—Harness, Dickey & Pierce

(57) ABSTRACT

A clamping circuit is provided, which may clamp a voltage at a node of a circuit to a stable level by using a transistor already included in the circuit. The clamping circuit may clamp a voltage at a first node of a circuit inside a semiconductor chip to a more stable level when electro-static discharge (ESD) occurs. The clamping circuit may include a transistor and a capacitive element to store a control voltage to turn on the transistor in response to ESD.

20 Claims, 3 Drawing Sheets

VOLTAGE CLAMPING CIRCUITS USING MOS TRANSISTORS AND SEMICONDUCTOR CHIPS HAVING THE SAME AND METHODS OF CLAMPING VOLTAGES

PRIORITY STATEMENT

This application claims priority under 35 U.S.C. §119 to Korean Patent Application No. 10-2006-0001668, filed on Jan. 6, 2006, in the Korean Intellectual Property Office (KIPO), the entire contents of which are incorporated herein by reference.

BACKGROUND

Example embodiments may relate to circuits and/or semiconductor chips. For example, example embodiments may relate to voltage clamping circuits which may clamp a voltage at a node inside a circuit of a semiconductor chip. Example embodiments may include MOS transistors and/or semiconductor chips having the same.

DESCRIPTION OF CONVENTIONAL ART

In the conventional art, when a semiconductor chip is integrated, a current may be introduced by a wire through a pad due to static electricity. The current may cause errors and/or damage the semiconductor chip. To protect a circuit inside the semiconductor chip from electro-static discharge (ESD), or similar occurrences, the semiconductor chip may include an ESD protection circuit. The ESD protection circuit may be arranged near a pad in the semiconductor chip and/or may be located between the pad and a circuit of the semiconductor chip. Accordingly, when current generated by static electricity is introduced through the pad, the ESD protection circuit may discharge the current, thereby suppressing damage to the circuit in the semiconductor chip.

To suppress voltage variations at nodes on circuits in a conventional semiconductor chip, clamping elements may be used. The clamping elements may clamp the voltages at the nodes. The clamping elements, which may be comprised of metal oxide semiconductors (MOS) and/or silicon controlled rectifiers (SCR), may carry out snapback operations.

As a voltage variation occurs at a node on a circuit in the semiconductor chip due to static electricity, the internal circuit may malfunction. For example, voltage variations may damage relatively thin gate oxides.

FIG. 1 is an example of a conventional level shifter. Referring to FIG. 1, the level shifter may modify a voltage of an input signal and output the modified voltage. The level shifter may be comprised of PMOS transistors P1 and P2, NMOS transistors N1 and N2, and/or an inverter I1.

The PMOS transistors P1 and P2 may have a latch structure, and may be connected to each other. A gate electrode of the PMOS transistor P1 may be connected to a drain electrode of PMOS transistor P2, and a gate electrode of the PMOS transistor P2 may be connected to a drain electrode of the PMOS transistor P1. Source electrodes of the PMOS transistors P1 and P2 may be connected to a boost voltage $V_p$.

A gate electrode of the NMOS transistor N1 may be connected to an input signal $V_{in}$, and a gate electrode of the NMOS transistor N2 may be connected to an inverted signal $V_{in}$. Drain electrodes of the NMOS transistors N1 and N2 may be connected to the PMOS transistors P1 and P2, respectively, and the source electrodes of the NMOS transistors N1 and N2 may be connected to a ground voltage GND.

When the input signal $V_{in}$ transitions from low level to high level, the NMOS transistor N1 may turn on, and the NMOS transistor N2 may turn off. In this example, a voltage at node (a) transitions to the low level, and may be applied to the gate electrode of the PMOS transistor P2, thereby turning on the PMOS transistor P2. In addition, a voltage at node (b) transitions to the high level, and may be applied to the gate electrode of the PMOS transistor P1, thereby turning off the PMOS transistor P1. As a result, the boost voltage $V_p$ at the node (b) may be provided as an output signal $V_{out}$.

When the input signal $V_{in}$ transitions from the high level to the low level, the NMOS transistor N2 may turn on, and the NMOS transistor N1 may turn off. In this example, the voltage at the node (b) transitions to the low level, and may be applied to the gate electrode of the PMOS transistor P1, thereby turning on the PMOS transistor P1. In addition, the voltage at the node (a) transitions to the high level, and may be applied to the gate electrode of the PMOS transistor P2, thereby turning off the PMOS transistor P2. As a result, the ground voltage GND at the node (b) may be provided as an output signal $V_{out}$.

The voltage at the node (b), which may be an output voltage $V_{out}$ of the level shifter, may be output as the high level voltage of the boost voltage $V_p$ or the low level voltage of the ground voltage GND in a more stable manner. In addition, the semiconductor chip may include a circuit for stabilizing the voltage at the node (b) in FIG. 1.

However, an extra clamping circuit may increase the size of the semiconductor chip. Furthermore, a clamping circuit that clamps a relatively high voltage generated by ESD may require a large design rule, which may limit size reduction in semiconductor chips.

SUMMARY

Example embodiments will be more fully apparent from the following detailed description, the accompanying drawings, and the associated claims.

Example embodiments provide a voltage clamping circuit which may clamp a voltage at a node. The voltage clamping circuit may comprise a MOS transistor included in a circuit of a semiconductor chip, and a semiconductor chip having the same.

According to at least one example embodiment, a clamping circuit may include a MOS transistor of a first circuit and a capacitive element. A first electrode of the MOS transistor may be connected to a first node and a second electrode of the MOS transistor may be connected to a ground voltage. The capacitive element may be connected between the first pad and the MOS transistor, and the capacitive element may store a control voltage to turn on the MOS transistor in response to electro-static discharge. For example, the clamping circuit may clamp a voltage at the first node of the first circuit to a stable level and the first circuit may send and/or receive signals through the first pad.

In at least one example embodiment, a method of clamping a voltage of a first node of a first circuit in response to electro-static discharge (ESD) may include storing a voltage in a capacitance connected to a MOS transistor of a circuit in response to ESD, and clamping the voltage of the first node by turning on the MOS transistor with the stored voltage in response to ESD.

In an example embodiment, there may be provided a clamping circuit for clamping a voltage at a first node of a circuit to a stable level. The example clamping circuit may be inside a semiconductor chip, and may include a MOS transistor and a capacitive element. The MOS transistor may be included in the circuit that sends/receives signals through a pad, may have a first electrode connected to the first node that requires clamping, and may have a second electrode connected to a ground voltage. The capacitive element may be connected between the pad and the MOS transistor and may store a control voltage that may turn on the MOS transistor in response to an ESD occurrence.

In an example embodiment, the MOS transistor may be a gate coupled NMOS (GCNMOS). The capacitive element may be connected between the pad and a gate electrode of the MOS transistor, according to this example embodiment.

In an example embodiment, the capacitive element may be a capacitor.

In another example embodiment, the circuit may be a level shifter comprising a pair of PMOS transistors and a pair of NMOS transistors. The PMOS transistors may form a latch structure. The pair of NMOS transistors may be respectively connected to the PMOS transistors. Additionally, the MOS transistor of the example clamping circuit may be one of the NMOS transistors, of which a first electrode may be connected to an output node of the level shifter and a second electrode may be connected to a ground voltage.

In an example embodiment, output node of the level shifter may output a voltage at the first node.

In an example embodiment, voltage drop circuit may be connected between a second node and a ground voltage. The second node may be connected to the gate electrode of the MOS transistor and/or the capacitive element.

According to another example embodiment, there may be provided a semiconductor chip comprising one or more pads and a first internal circuit which sends/receives signals through the pads. The first circuit may include a MOS transistor of which a first electrode may be connected to a first node which may require clamping, a second electrode may be connected to a ground voltage, and which may output a voltage at the first node as a signal. Additionally, the capacitive element may be connected between a pad and the MOS transistor, and may store a control voltage. The control voltage may turn on the MOS transistor during an ESD occurrence.

According to another example embodiment, there may be provided a method of clamping a voltage of a first node of a first circuit in response to electro-static discharge (ESD), the method comprising storing a voltage in a capacitance connected to a MOS transistor of a circuit in response to the ESD and clamping the voltage of the first node by turning on the MOS transistor with the stored voltage in response to the ESD.

BRIEF DESCRIPTION OF THE DRAWINGS

Example embodiments will become more apparent by describing in detail example embodiments with reference to the attached drawings in which.

DETAILED DESCRIPTION OF EXAMPLE EMBODIMENTS

Figure 1:
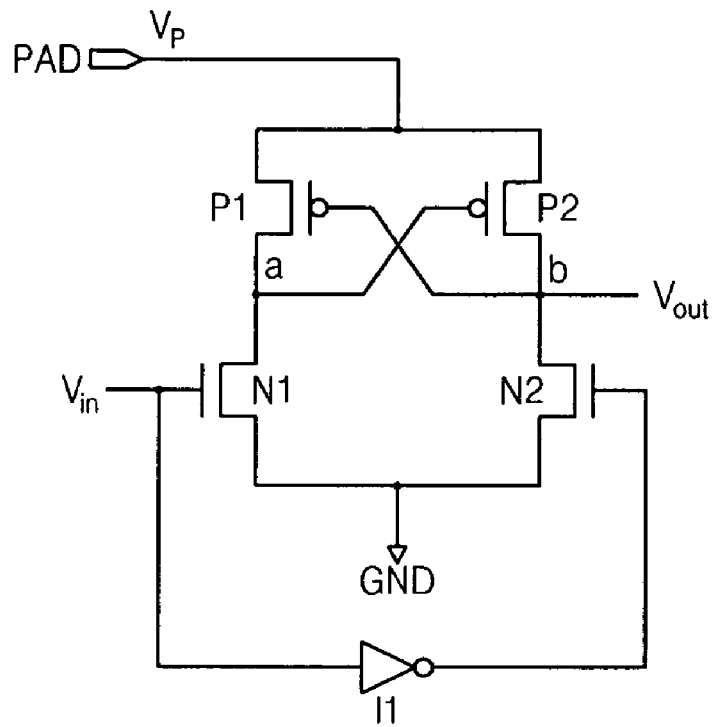
FIG. 1 is a circuit diagram illustrating a conventional level shifter included in a semiconductor chip.

Detailed illustrative embodiments are disclosed herein. However, specific structural and functional details disclosed herein are merely representative for purposes of describing example embodiments. Examples disclosed herein may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of these embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, example embodiments will be described in detail by explaining example embodiments with reference to the attached drawings. Like reference numerals in the drawings denote like elements.

Figure 2:
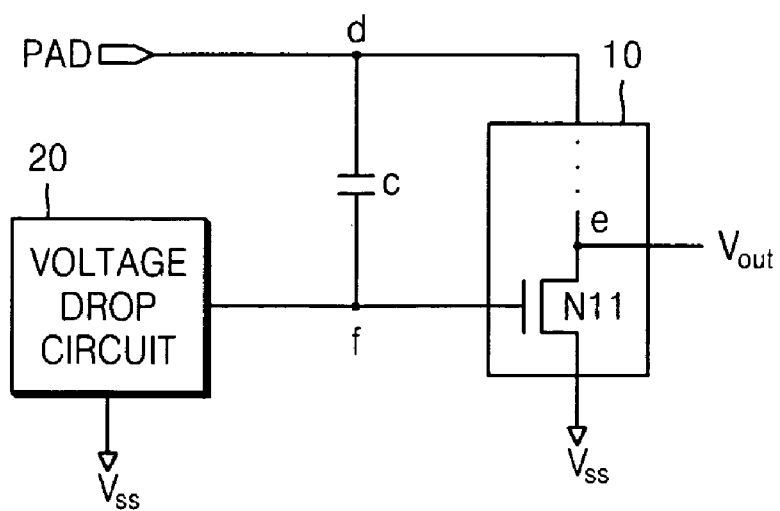
FIG. 2 is a circuit diagram illustrating a clamping circuit, according to an example embodiment.

FIG. 2 is a circuit diagram illustrating a clamping circuit, according to an example embodiment. The clamping circuit may clamp a voltage at a first node (e) of a circuit 10 of a semiconductor chip in response to electro-static discharge (ESD) or similar occurrences. The clamping circuit may suppress the boosting of the voltage at the first node (e) and/or being output to an external circuit erroneously. As shown in FIG. 2, the clamping circuit may include a MOS transistor N11 and/or a capacitive element C. In at least one example embodiment, the capacitive element C may be a capacitor; however, any capacitive element may be used. For example, P-N junctions (e.g., diodes) and metal-oxide-semiconductor configurations (e.g., MOS capacitors) may be used as capacitive elements in some instances, as well as almost any transistor.

The circuit 10 may send and receive signals through an input/output pad PAD. The circuit 10 of the semiconductor chip may include the NMOS transistor N11. A first electrode of the NMOS transistor N11 may be connected to the first node (e) and a second electrode may be connected to a voltage $V_{ss}$. The second electrode of the NMOS transistor N11 may also be connected to a ground node. The capacitive element C may be connected between the input/output pad PAD and a gate electrode of the NMOS transistor N11.

The circuit 10 may output a voltage signal $V_{out}$ to the external circuit through the first node (e). When ESD occurs, a positive electric charge may be introduced to the first node (e) raising the voltage at the first node (e). In this example, the circuit receiving a voltage signal from the first node (e) may malfunction due to the introduction of a relatively high voltage, for example, a voltage exceeding an operating-voltage range. In addition, the relatively high voltage may damage a gate oxide. In a clamping circuit, according to an example embodiment, when ESD occurs, the voltage rise at the first node (e) may be suppressed. For example, the clamping circuit may turn on the NMOS transistor N11 of the circuit 10. Accordingly, the NMOS transistor N11 may function as a pull-down transistor, decreasing the voltage at the first node (e).

The NMOS transistor N11 may turn on in response to ESD, thereby pulling down the voltage at the first node (e). The capacitive element C may store a control voltage to turn on the NMOS transistor N11. The capacitive element C may be connected between the input/output pad PAD and the gate electrode of the NMOS transistor N11. The positive electric charge introduced from the input/output pad PAD may be transferred to a ground node via the capacitive element C and a voltage drop circuit 20 through a node (d). The voltage drop circuit 20 may be connected between a second node (f), where the gate electrode of the NMOS transistor N11 and the capacitive element C may be connected, and a ground node Vss. For example, the voltage drop circuit 20 may include a resistive element to obtain a voltage drop when current flows.

The positive electric charge transferred through the input/output pad PAD may be transferred to the ground node $V_{ss}$ via the voltage drop circuit 20, and a voltage corresponding to the voltage drop at the voltage drop circuit 20 may be applied to the second node (f). Because the capacitive element C may be connected between the gate electrode of the NMOS transistor N11 and the first electrode thereof (electrode connected to the first node (e)), the capacitive element C may store enough voltage to turn on the NMOS transistor N11. In this example, the capacitance of the capacitive element C may be considered to be relatively small.

According to the above-described FIG. 2, when ESD occurs, a control voltage to turn on the NMOS transistor N11 may be stored in the capacitive element C in response to the introduction of positive electric charge. As a result, when ESD occurs, the NMOS transistor N11 may maintain a turn-on state, and the control voltage stored in capacitive element C may be reduced. Further, the voltage applied to the gate electrode of the NMOS transistor N11 may be lowered, thereby suppressing damage to the gate oxide.

The NMOS transistor N11 may turn on in response to the control voltage. As the NMOS transistor N11 may function as a pull-down transistor, the voltage at the first node (e) may be clamped in a stable manner when ESD occurs. Because an NMOS transistor included in the circuit may be used as the NMOS transistor N11, an extra circuit element for clamping the first node (e) may not be necessary.

Figure 3:
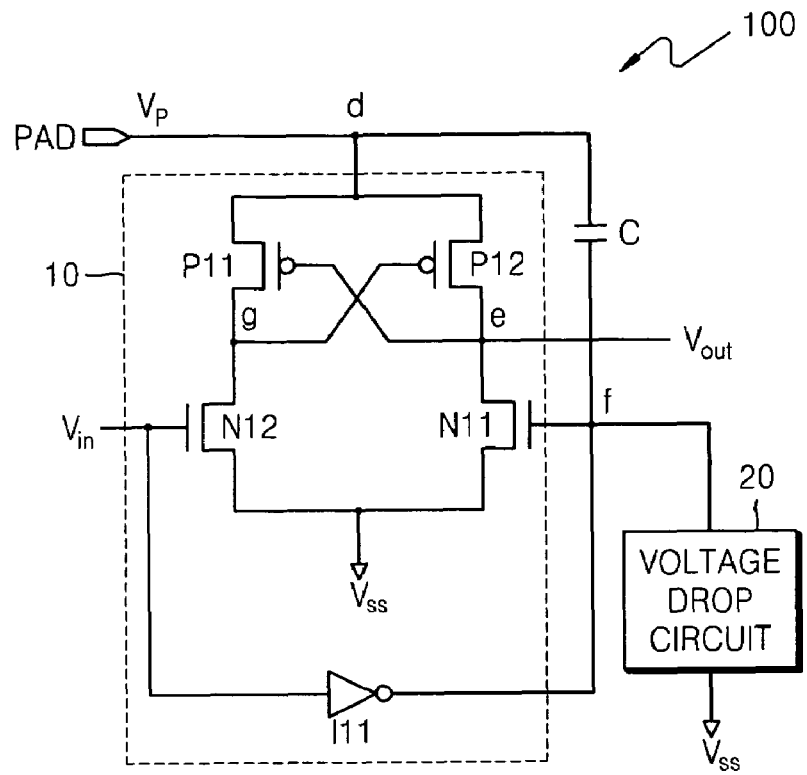
FIG. 3 is a circuit diagram illustrating a level shifter/clamping circuit, where the circuit 10 of FIG. 2 may be a level shifter, according to an example embodiment.

FIG. 3 is a circuit diagram illustrating a level shifter/clamping circuit, according to an example embodiment. As shown in FIG. 3, a level shifter 10 is an example of the circuit 10 of FIG. 2. The level shifter 10 may include PMOS transistors P11 and P12, NMOS transistors N11 and N12, and/or an inverter I11. The operation of the level shifter 10 may be similar to that of the level shifter described in FIG. 1, and thus a detailed description thereof will be omitted for the sake of brevity.

As shown in FIG. 3, a node (g) may be connected to a gate of the PMOS transistor P12, a first node (e) may be connected to a gate of the PMOS transistor P11, and the PMOS transistors P11 and P12 may form a latch structure. The first node (e) may be connected to an output node of the level shifter 10 and thus a voltage at the first node (e) may be output as a voltage $V_{out}$.

A first electrode of the NMOS transistor N11 may be connected to the output voltage of the level shifter 10, and a second electrode may be connected to a ground voltage $V_{ss}$. A capacitive element C may be connected between the NMOS transistor N11 and an input/output pad PAD. The capacitive element C may be connected between a gate electrode of the NMOS transistor N11 and the input/output pad PAD. A voltage drop circuit 20 may be further included between a second node (f), where the NMOS transistor N11 and the capacitive element C are connected, and the ground voltage $V_{ss}$. The voltage drop circuit 20 may be a resistive circuit that drops a voltage when current flows.

When an input voltage $V_{in}$ is applied, a voltage signal having a voltage based on the operation of the level shifter may be output as the voltage $V_{out}$. However, electric charge generated by ESD may be introduced through a node (d) via the input/output pad PAD where a boost voltage $V_p$ is introduced. In this example, a voltage at the first node (e) may rise due to the introduced electric charge. In the clamping circuit, according to an example embodiment, the NMOS transistor N11 may function as a pull-down transistor, thereby dropping the voltage at the first node (e) connected to the first electrode of the NMOS transistor N11.

The electric charge, which may be generated by ESD and may be transferred through the node (d), may be transferred to the ground voltage $V_{ss}$ via the capacitive element C and the voltage drop circuit 20. A voltage corresponding to the voltage drop at the voltage drop circuit 20 may be applied to the second node (f). The capacitive element C may store a control voltage that may turn on the NMOS transistor N11. As a result, the control voltage may be stored in the capacitive element C during an ESD occurrence, the NMOS transistor N11 may turn on, and the voltage at the first node (e) may be clamped.

The capacitive element C may store a voltage sufficient to turn on the NMOS transistor N11, and thus the capacitance of the capacitive element C may be relatively small. In addition, as the NMOS transistor N11 inside the level shifter 10 may function as a clamping circuit. Therefore, example embodiments may reduce chip size. Moreover, when a voltage rises, for example, as ESD occurs, the NMOS transistor N11 may turn on, thereby performing a switching operation. Otherwise, the NMOS transistor N11 may perform the general operation of the level shifter 10.

Figure 4:
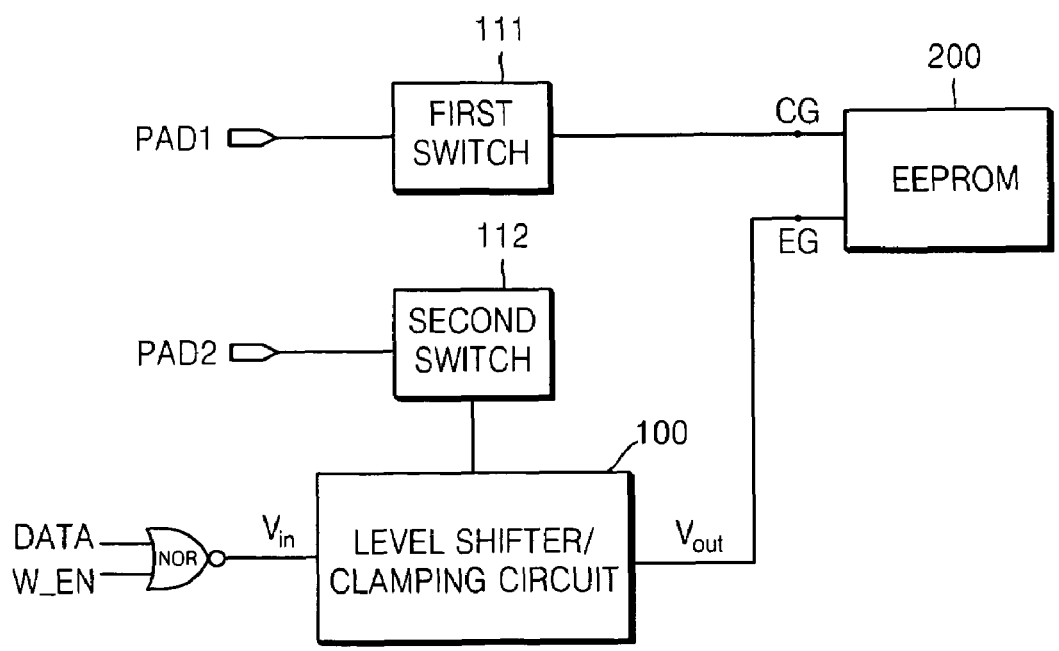
FIG. 4 is a block diagram illustrating a semiconductor chip, according to an example embodiment.

FIG. 4 is a block diagram illustrating a semiconductor chip, according to an example embodiment. Referring to FIG. 4, the semiconductor chip may include a NOR gate, which may receive a data signal DATA and/or a write enable signal W_EN to perform a NOR operation, and a level shifter/clamping circuit 100 which may receive an input signal $V_{in}$ from the NOR gate and output an signal $V_{out}$. For example, the level shifter/clamping circuit 100 may be the same as the level shifter/clamping circuit 100 of FIG. 3.

As an example of a circuit included in the semiconductor chip, a writable/erasable memory device, for example, an electrically erasable programmable read-only memory (EE-PROM) 200, may be shown in FIG. 4. Control signals may be transmitted through a first pad PAD 1 and a second pad PAD 2. The control signals may be transmitted to a control gate CG and the level shifter/clamping circuit 100 through a first switch 111 and a second switch 112, respectively. For example, the first and second switch may be additional MOS transistors, transmission gates, or any suitable switching device.

When electric charge generated by ESD is introduced through the second pad PAD 2, a clamping operation may be carried out in a similar manner as described with regard to FIG. 3. Thus, the output voltage $V_{out}$ of the level shifter/clamping circuit 100 may be output with a voltage drop. In the level shifter/clamping circuit 100, an NMOS transistor that is a clamping element may perform a pull-down operation, thereby clamping the output signal $V_{out}$ to a ground voltage.

For erasing and reading operations of the EEPROM 200, a power voltage may be applied to the control gate CG of the EEPROM 200, and a voltage of 0V may be applied to an erase gate EG of the EEPROM 200. When erasing and reading operations are performed, and the output voltage $V_{out}$ of the level shifter/clamping circuit 100 may increase due to possible ESD, the EEPROM 200 may malfunction, and for example, the EEPROM 200 may perform data programming in an erasing or reading mode. However, when the clamping circuit is configured using a MOS transistor included in the level shifter as describe above, the output voltage $V_{out}$ of the level shifter/clamping circuit 100 may be clamped in a stable manner, thereby suppressing malfunctions of the EEPROM 200.

Figure 5A:
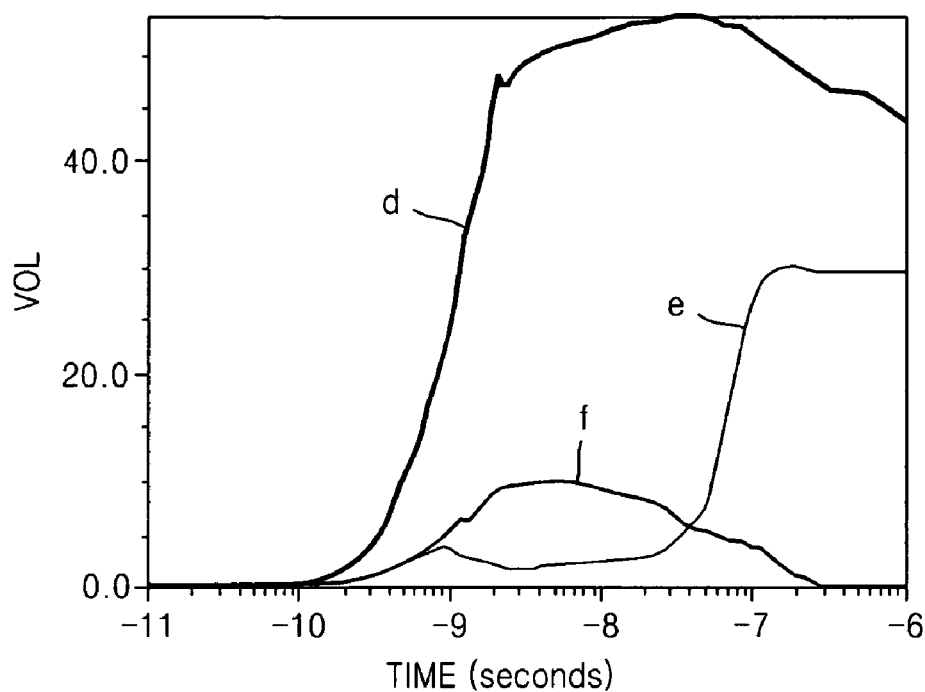
FIGS. 5A and 5B are graphs illustrating an operation result of a clamping circuit, according to an example embodiment in comparison with conventional art.
Figure 5B:
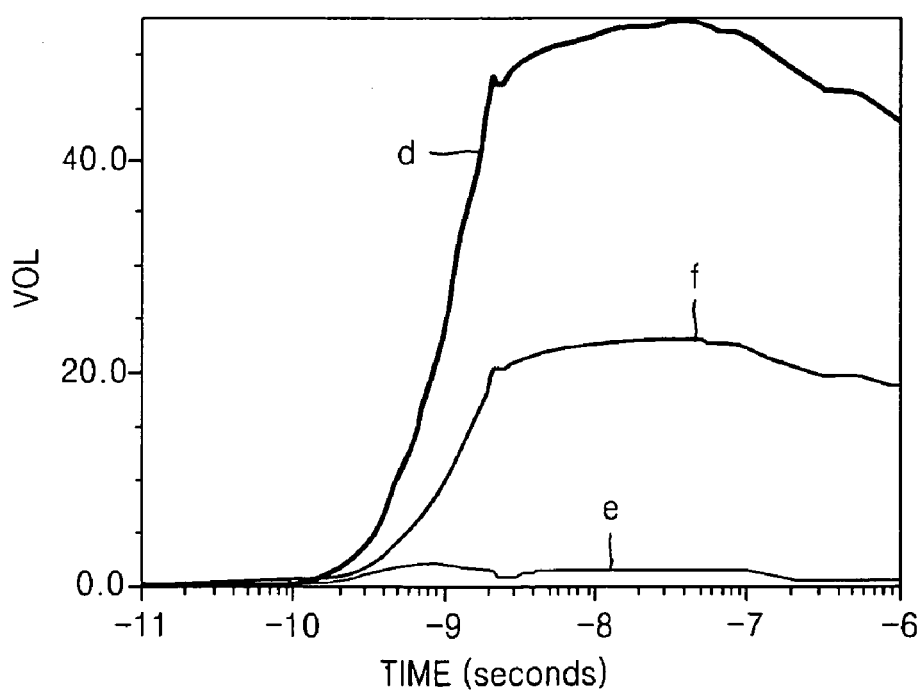

FIGS. 5A and 5B are graphs illustrating a result of a clamping circuit operation, according to an example embodiment with comparison to the conventional art.

In the graphs of FIGS. 5A and B, voltage variations at the nodes (d), (e), and (f) of FIG. 3 may be shown with respect to a time axis.

FIG. 5A may depict voltage variations at each node due to ESD when a capacitive element C is not included in a level shifter. Referring to FIG. 5A, when electric charge generated by ESD is introduced through a pad, a voltage at the node (d) may rise. In addition, because the node (f) may have a relatively low voltage in normal operation, the NMOS transistor N11 of FIG. 3 may maintain a turn-off state. Accordingly, a voltage at the node (e) may rise over 20V in this example.

FIG. 5B may show voltage variations at nodes due to ESD when the capacitive element C is connected to a gate electrode of the MOS transistor in the level shifter. Referring to FIG. 5B, electric charge generated by ESD may be introduced, thereby increasing the voltage at the node (d). In response to the electric charge, a control voltage may be stored in the capacitive element C.

A voltage at the node (f) may be applied to the gate electrode of the MOS transistor, and thus the MOS transistor may turn on. Then, the node (e) may be clamped by a pull-down operation of the MOS transistor, thereby dropping a voltage at the node (e) to approximately 0V. As a result, the output voltage $V_{out}$ of the level shifter may be output after being clamped to a stable level. This may prevent the internal circuit from receiving an unstable voltage $V_{out}$.

In example embodiments, a clamping circuit may be implemented by using a MOS transistor included in an internal circuit of a semiconductor chip. Therefore, an extra element may not be necessary, thereby reducing chip size. In addition, a clamping operation may be performed in a more stable manner.

With some embodiments having thus been described, it will be obvious that the same may be varied in many ways. Such variations are not to be regarded as a departure from the spirit and scope of example embodiments, and all such modifications are intended to be included within the scope of the example embodiments.

What is claimed is:

1. A clamping circuit to clamp a voltage at a first node of a first circuit, the first circuit to send and/or receive signals through a first pad, the clamping circuit comprising:
   a MOS transistor of the first circuit, a first electrode of the MOS transistor connected to the first node and a second electrode of the MOS transistor connected to a ground voltage; and
   a capacitive element connected between the first pad and the MOS transistor, the capacitive element storing a control voltage to turn on the MOS transistor in response to electro-static discharge (ESD),
   wherein the first circuit is a level shifter including a pair of PMOS transistors forming a latch structure and a pair of NMOS transistors that are connected to the PMOS transistors, wherein the MOS transistor is one of the pair of NMOS transistors.

2. The clamping circuit of claim 1, wherein:
   the MOS transistor is a gate coupled NMOS (GCNMOS) transistor; and
   the capacitive element is connected between the first pad and a gate electrode of the GCNMOS transistor.

3. The clamping circuit of claim 1, wherein the capacitive element is a capacitor.

4. The clamping circuit of claim 1, wherein:
   the first node is an output node of the level shifter.

5. The clamping circuit of claim 4, wherein the output node of the level shifter outputs a voltage at the first node.

6. The clamping circuit of claim 1, wherein:
   a voltage drop circuit is connected between a second node and a ground voltage; and
   the second node is where the MOS transistor and the capacitive element are connected.

7. A semiconductor chip comprising:
   a clamping circuit to clamp a voltage at a first node of a first circuit, the first circuit to send and/or receive signals through a first pad; and
   a second pad,
   wherein the clamping circuit includes
      a MOS transistor of the first circuit, a first electrode of the MOS transistor connected to the first node and a second electrode of the MOS transistor connected to a ground voltage; and
      a capacitive element connected between the first pad and the MOS transistor, the capacitive element storing a control voltage to turn on the MOS transistor in response to electro-static discharge (ESD),
   wherein the first circuit is a level shifter including a pair of PMOS transistors forming a latch structure and a pair of NMOS transistors that are connected to the PMOS transistors, and outputs a voltage at the first node to a second circuit as a voltage signal, wherein the MOS transistor is one of the pair of NMOS transistors.

8. The semiconductor chip of claim 7, wherein:

the MOS transistor is a gate coupled NMOS (GCNMOS) transistor; and the capacitive element is connected between the first pad and a gate electrode of the GCNMOS transistor.

9. The semiconductor chip of claim 7, wherein:

the first node is an output node of the level shifter.

10. The semiconductor chip of claim 9, wherein the level shifter outputs a voltage at the first node.

11. The semiconductor chip of claim 7, wherein:

a voltage drop circuit is connected between a second node and a ground voltage; and the second node is where the MOS transistor and the capacitive element are connected.

12. The semiconductor chip of claim 7, further comprising:

a first switch connected between a second pad and the second circuit;

a second switch connected between the first pad and the clamping circuit; and a logic gate connected to an input of the clamping circuit.

13. The semiconductor chip of claim 12, wherein the first switch transmits control signals to an input of the second circuit.

14. The semiconductor chip of claim 12, wherein the second switch transmits control signals to the clamping circuit.

15. The semiconductor chip of claim 12, wherein the second circuit is an electrically erasable programmable read-only memory (EEPROM).

16. The semiconductor chip of claim 15, wherein the logic gate receives a data signal and a write enable signal for the EEPROM.

17. The semiconductor chip of claim 12, wherein the logic gate is a NOR gate.

18. A method of clamping a voltage of a first node of a first circuit in response to electro-static discharge (ESD), the method comprising:

storing a voltage in a capacitance connected to a MOS transistor of a circuit in response to the ESD; and clamping the voltage of the first node by turning on the MOS transistor with the stored voltage in response to the ESD, wherein the first circuit is a level shifter including a pair of PMOS transistors forming a latch structure and a pair of NMOS transistors that are connected to the PMOS transistors, wherein the MOS transistor is one of the pair of NMOS transistors.

19. The method of claim 18, further comprising:

transferring excess charge from the ESD to ground through at least one of the capacitance and a voltage drop circuit.

20. The method of claim 19, further comprising:

turning off the MOS transistor.

* * * * *